(12) United States Patent
Hytha et al.

(10) Patent No.: US 11,682,712 B2
(45) Date of Patent: Jun. 20, 2023

(54) METHOD FOR MAKING SEMICONDUCTOR DEVICE INCLUDING SUPERLATTICE WITH O18 ENRICHED MONOLAYERS

(71) Applicant: Atomera Incorporated, Los Gatos, CA (US)

(72) Inventors: Marek Hytha, Brookline, MA (US); Nyles Wynn Cody, Tempe, AZ (US); Keith Doran Weeks, Chandler, AZ (US)

(73) Assignee: ATOMERA INCORPORATED, Los Gatos, CA (US)

(*) Notice: Subject to any disclaimer, the term of this patent is extended or adjusted under 35 U.S.C. 154(b) by 0 days.

(21) Appl. No.: 17/330,860

(22) Filed: May 26, 2021

(65) Prior Publication Data

US 2022/0384612 A1    Dec. 1, 2022

(51) Int. Cl.
  *H01L 29/66*    (2006.01)
  *H01L 29/15*    (2006.01)

(52) U.S. Cl.
  CPC ...... *H01L 29/66431* (2013.01); *H01L 29/152* (2013.01)

(58) Field of Classification Search
  CPC combination set(s) only.
  See application file for complete search history.

(56) References Cited

U.S. PATENT DOCUMENTS

| | | |
|---|---|---|
| 4,937,204 A | 6/1990 | Ishibashi et al. |
| 5,216,262 A | 6/1993 | Tsu |
| 5,357,119 A | 10/1994 | Wang et al. |
| 5,683,934 A | 11/1997 | Candelaria |
| 5,796,119 A | 8/1998 | Seabaugh |
| 6,141,361 A | 10/2000 | Mears et al. |
| 6,376,337 B1 | 4/2002 | Wang et al. |
| 6,472,685 B2 | 10/2002 | Takagi |
| 6,741,624 B2 | 5/2004 | Mears et al. |
| 6,830,964 B1 | 12/2004 | Mears et al. |
| 6,833,294 B1 | 12/2004 | Mears et al. |
| 6,878,576 B1 | 4/2005 | Mears et al. |
| 6,891,188 B2 | 5/2005 | Mears et al. |

(Continued)

FOREIGN PATENT DOCUMENTS

| | | |
|---|---|---|
| GB | 2347520 | 6/2000 |
| WO | 2020092492 | 5/2020 |

OTHER PUBLICATIONS

U.S. Appl. No. 16/513,825, filed 17/17/2019; Burton et al.

(Continued)

*Primary Examiner* — Farun Lu
*Assistant Examiner* — Mohammad A Rahman
(74) *Attorney, Agent, or Firm* — Allen, Dyer, Doppelt, + Gilchrist, P.A. Attorneys at Law

(57) ABSTRACT

A method for making a semiconductor device may include forming a semiconductor layer, and forming a superlattice adjacent the semiconductor layer and including stacked groups of layers. Each group of layers may include stacked base semiconductor monolayers defining a base semiconductor portion, and at least one oxygen monolayer constrained within a crystal lattice of adjacent base semiconductor portions. The at least one oxygen monolayer of a given group of layers may comprise an atomic percentage of $^{18}O$ greater than 10 percent.

24 Claims, 14 Drawing Sheets

(56) References Cited

U.S. PATENT DOCUMENTS

| | | |
|---|---|---|
| 6,897,472 B2 | 5/2005 | Mears et al. |
| 6,908,846 B2 | 6/2005 | McMillin et al. |
| 6,927,413 B2 | 8/2005 | Mears et al. |
| 6,952,018 B2 | 10/2005 | Mears et al. |
| 6,958,486 B2 | 10/2005 | Mears et al. |
| 6,993,222 B2 | 1/2006 | Mears et al. |
| 7,018,900 B2 | 3/2006 | Kreps |
| 7,033,437 B2 | 4/2006 | Mears et al. |
| 7,034,329 B2 | 4/2006 | Mears et al. |
| 7,045,377 B2 | 5/2006 | Mears et al. |
| 7,045,813 B2 | 5/2006 | Mears et al. |
| 7,071,119 B2 | 7/2006 | Mears et al. |
| 7,105,895 B2 | 9/2006 | Wang et al. |
| 7,109,052 B2 | 9/2006 | Mears et al. |
| 7,123,792 B1 | 10/2006 | Mears et al. |
| 7,148,712 B1 | 12/2006 | Prey, Jr. et al. |
| 7,153,763 B2 | 12/2006 | Hytha et al. |
| 7,202,494 B2 | 4/2007 | Blanchard et al. |
| 7,227,174 B2 | 6/2007 | Mears et al. |
| 7,229,902 B2 | 6/2007 | Mears et al. |
| 7,265,002 B2 | 9/2007 | Mears et al. |
| 7,279,699 B2 | 10/2007 | Mears et al. |
| 7,279,701 B2 | 10/2007 | Kreps |
| 7,288,457 B2 | 10/2007 | Kreps |
| 7,303,948 B2 | 12/2007 | Mears et al. |
| 7,432,524 B2 | 10/2008 | Mears et al. |
| 7,435,988 B2 | 10/2008 | Mears et al. |
| 7,436,026 B2 | 10/2008 | Kreps |
| 7,446,002 B2 | 11/2008 | Mears et al. |
| 7,446,334 B2 | 11/2008 | Mears et al. |
| 7,491,587 B2 | 2/2009 | Rao |
| 7,514,328 B2 | 4/2009 | Rao |
| 7,517,702 B2 | 4/2009 | Halilov et al. |
| 7,531,828 B2 | 5/2009 | Mears et al. |
| 7,531,829 B2 | 5/2009 | Blanchard |
| 7,531,850 B2 | 5/2009 | Blanchard |
| 7,586,116 B2 | 9/2009 | Kreps et al. |
| 7,586,165 B2 | 9/2009 | Blanchard |
| 7,598,515 B2 | 10/2009 | Mears et al. |
| 7,612,366 B2 | 11/2009 | Mears et al. |
| 7,625,767 B2 | 12/2009 | Huang et al. |
| 7,659,539 B2 | 2/2010 | Kreps et al. |
| 7,700,447 B2 | 4/2010 | Dukovski et al. |
| 7,718,996 B2 | 5/2010 | Dukovski et al. |
| 7,781,827 B2 | 8/2010 | Rao |
| 7,812,339 B2 | 10/2010 | Mears et al. |
| 7,863,066 B2 | 1/2011 | Mears et al. |
| 7,880,161 B2 | 2/2011 | Mears et al. |
| 7,928,425 B2 | 4/2011 | Rao |
| 8,389,974 B2 | 3/2013 | Mears et al. |
| 8,450,123 B2 | 5/2013 | Okazaki et al. |
| 8,871,670 B2 | 10/2014 | Seebauer |
| 9,275,996 B2 | 3/2016 | Mears et al. |
| 9,343,293 B2 | 5/2016 | Underwood et al. |
| 9,406,753 B2 | 8/2016 | Mears et al. |
| 9,558,939 B1 | 1/2017 | Stephenson et al. |
| 9,666,669 B1 | 5/2017 | Balakrishnan et al. |
| 9,734,978 B1 | 8/2017 | Wedding et al. |
| 9,899,479 B2 | 2/2018 | Mears et al. |
| 9,941,359 B2 | 4/2018 | Mears et al. |
| 9,972,685 B2 | 5/2018 | Mears et al. |
| 10,084,045 B2 | 9/2018 | Mears et al. |
| 10,107,854 B2 | 10/2018 | Roy |
| 10,109,342 B2 | 10/2018 | Roy |
| 10,109,479 B1 | 10/2018 | Mears et al. |
| 10,170,560 B2 | 1/2019 | Mears |
| 10,170,603 B2 | 1/2019 | Mears et al. |
| 10,170,604 B2 | 1/2019 | Mears et al. |
| 10,191,105 B2 | 1/2019 | Roy |
| 10,249,745 B2 | 4/2019 | Mears et al. |
| 10,276,625 B1 | 4/2019 | Mears et al. |
| 10,304,881 B1 | 5/2019 | Chen et al. |
| 10,355,151 B2 | 7/2019 | Chen et al. |
| 10,361,243 B2 | 7/2019 | Mears et al. |
| 10,367,028 B2 | 7/2019 | Chen et al. |
| 10,367,064 B2 | 7/2019 | Rao |
| 10,381,242 B2 | 8/2019 | Takeuchi |
| 10,396,223 B2 | 8/2019 | Chen et al. |
| 10,410,880 B2 | 9/2019 | Takeuchi |
| 10,453,945 B2 | 10/2019 | Mears et al. |
| 10,461,118 B2 | 10/2019 | Chen et al. |
| 10,468,245 B2 | 11/2019 | Weeks et al. |
| 10,529,757 B2 | 1/2020 | Chen et al. |
| 10,529,768 B2 | 1/2020 | Chen et al. |
| 10,566,191 B1 | 2/2020 | Weeks et al. |
| 10,580,866 B1 | 3/2020 | Takeuchi et al. |
| 10,580,867 B1 | 3/2020 | Takeuchi et al. |
| 10,593,761 B1 | 3/2020 | Takeuchi et al. |
| 10,608,027 B2 | 3/2020 | Chen et al. |
| 10,608,043 B2 | 3/2020 | Chen et al. |
| 10,615,209 B2 | 4/2020 | Chen et al. |
| 10,636,879 B2 | 4/2020 | Rao |
| 10,727,049 B2 | 7/2020 | Weeks et al. |
| 10,741,436 B2 | 8/2020 | Stephenson et al. |
| 10,763,370 B2 | 9/2020 | Stephenson |
| 10,777,451 B2 | 9/2020 | Stephenson et al. |
| 10,811,498 B2 | 10/2020 | Weeks et al. |
| 10,818,755 B2 | 10/2020 | Takeuchi et al. |
| 10,825,901 B1 | 11/2020 | Burton et al. |
| 10,825,902 B1 | 11/2020 | Burton et al. |
| 10,840,335 B2 | 11/2020 | Takeuchi et al. |
| 10,840,336 B2 | 11/2020 | Connelly et al. |
| 10,840,337 B2 | 11/2020 | Takeuchi et al. |
| 10,840,388 B1 | 11/2020 | Burton et al. |
| 10,847,618 B2 | 11/2020 | Takeuchi et al. |
| 10,854,717 B2 | 12/2020 | Takeuchi et al. |
| 10,868,120 B1 | 12/2020 | Burton et al. |
| 2002/0070390 A1* | 6/2002 | Chow .................. H01L 29/155 257/E29.189 |
| 2003/0034529 A1 | 2/2003 | Fitzgerald et al. |
| 2003/0057416 A1 | 3/2003 | Currie et al. |
| 2005/0167653 A1* | 8/2005 | Mears .................. H01L 29/861 257/E27.012 |
| 2005/0282330 A1 | 12/2005 | Mears et al. |
| 2006/0220118 A1 | 10/2006 | Stephenson et al. |
| 2006/0267130 A1 | 11/2006 | Rao |
| 2007/0012910 A1 | 1/2007 | Mears et al. |
| 2007/0020833 A1 | 1/2007 | Mears et al. |
| 2007/0178650 A1* | 8/2007 | Chen ...................... H01L 29/78 257/E29.085 |
| 2008/0012004 A1 | 1/2008 | Huang et al. |
| 2008/0258134 A1 | 10/2008 | Mears et al. |
| 2011/0215299 A1* | 9/2011 | Rao ..................... H01L 29/7833 257/E21.409 |
| 2012/0146113 A1 | 6/2012 | Suzuki et al. |
| 2015/0357414 A1 | 12/2015 | Mears |
| 2015/0362671 A1* | 12/2015 | Bell ........................ G02B 6/0286 385/124 |
| 2016/0149023 A1 | 5/2016 | Mears et al. |
| 2016/0358773 A1 | 12/2016 | Mears et al. |
| 2018/0337064 A1* | 11/2018 | Takeuchi ............ H01L 21/3221 |
| 2019/0058059 A1 | 2/2019 | Stephenson et al. |
| 2019/0189652 A1 | 6/2019 | Chen et al. |
| 2019/0279880 A1 | 9/2019 | Yamazaki et al. |
| 2019/0279897 A1 | 9/2019 | Stephenson et al. |
| 2019/0317277 A1 | 10/2019 | Stephenson |
| 2019/0319135 A1 | 10/2019 | Stephenson |
| 2019/0319167 A1 | 10/2019 | Stephenson |
| 2020/0135489 A1 | 4/2020 | Weeks et al. |
| 2020/0161429 A1 | 5/2020 | Takeuchi et al. |
| 2020/0343367 A1 | 10/2020 | Takeuchi et al. |
| 2020/0343380 A1 | 10/2020 | Takeuchi et al. |
| 2021/0020748 A1* | 1/2021 | Burton .............. H01L 29/42368 |

OTHER PUBLICATIONS

U.S. Appl. No. 16/513,832, filed 17/17/2019 Burton et al.
U.S. Appl. No. 16/513,875, filed 17/17/2019 Burton et al.
U.S. Appl. No. 16/513,906, filed 17/17/2019 Burton et al.
U.S. Appl. No. 16/801,287, filed Feb. 26, 2020 Weeks et al.
U.S. Appl. No. 16/801,305, filed Feb. 26, 2020 Weeks et al.
U.S. Appl. No. 16/810,957, filed Mar. 6, 2020 Cody et al.
U.S. Appl. No. 16/898,564, filed Jun. 11, 2020 Takeuchi et al.

(56) References Cited

OTHER PUBLICATIONS

U.S. Appl. No. 16/898,589, filed Jun. 11, 2020 Takeuchi et al.
U.S. Appl. No. 16/913,487, filed Jun. 26, 2020 Burton et al.
U.S. Appl. No. 16/913,546, filed Jun. 26, 2020 Burton et al.
U.S. Appl. No. 17/020,353, filed Sep. 14, 2020; Weeks et al.
U.S. Appl. No. 17/101,399, filed Nov. 23, 2020 Stephenson et al.
U.S. Appl. No. 17/236,289, filed Apr. 21, 2021 Hytha et al.
U.S. Appl. No. 17/236,329, filed Apr. 21, 2021 Hytha et al.
U.S. Appl. No. 17/330,831, filed May 26, 2021 Hytha et al.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu "Phenomena in silicon nanostructure device" published online Sep. 6, 2000 by Applied Physics and Materials Science & Processing, pp. 391-402.
R. Tsu "Si Based Green ELD: Si-Oxygen Superlattice" wysiwyg://1/http://www3.interscience.wiley.com/cgi-bin/abstract/72512946/start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.

* cited by examiner

|  |  | ANNEAL | | | | OXYGEN | | | CAP | CAP AND SPACER | | | |
|  |  | H2 ANNEAL | | N2 ANNEAL | | MST DOSE | MST LOSS | MST LOSS | CAP THK | MST LAYERS | MST BOTTOM | MST TOTAL | MST |
|  | RUN # | TEMP C | TIME SEC | TEMP C | TIME SEC | AT/CM^2 | AT/CM^2 | % | A | # | A | A | A/CYC |
| MEGA1 O16 | 5501 | 0 | 0 | 0 | 0 | 1.10E+15 | - | - | 238 | 4 | 311 | 73 | 24 |
|  | 5502 | 1000 | 120 | 0 | 0 | 5.04E+14 | 5.96E+14 | 54.2 | 225 | 4 | 297 | 72 | 24 |
|  | 5503 | 945 | 300 | 0 | 0 | 7.45E+14 | 3.55E+14 | 32.3 | 230 | 4 | 305 | 75 | 25 |
| MEGA1 O18 | 5827 | 0 | 0 | 0 | 0 | 1.129E+15 | - | - | 226 | 4 | 298 | 72 | 24 |
|  | 5828 | 850 | 1800 | 0 | 0 | 1.100E+15 | 2.90E+13 | 2.6 | 193 | 4 | 267 | 74 | 25 |
|  | 5829 | 945 | 300 | 0 | 0 | 8.827E+14 | 2.46E+14 | 21.8 | 221 | 4 | 294 | 73 | 24 |
|  | 5830 | 1000 | 120 | 0 | 0 | 7.022E+14 | 4.27E+14 | 37.8 | 216 | 4 | 292 | 76 | 25 |

FIG. 8

METHOD FOR MAKING SEMICONDUCTOR DEVICE INCLUDING SUPERLATTICE WITH O18 ENRICHED MONOLAYERS

TECHNICAL FIELD

The present disclosure generally relates to semiconductor devices and, more particularly, to semiconductor devices with enhanced semiconductor materials and associated methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of SiO2/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

U.S. Pat. No. 7,105,895 to Wang et al. discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices.

SUMMARY

A method for making a semiconductor device may include forming a semiconductor layer, and forming a superlattice adjacent the semiconductor layer and comprising a plurality of stacked groups of layers. Each group of layers may comprise a plurality of stacked base semiconductor monolayers defining a base semiconductor portion, and at least one oxygen monolayer constrained within a crystal lattice of adjacent base semiconductor portions. The at least one oxygen monolayer of a given group of layers may comprise an atomic percentage of $^{18}O$ greater than 10 percent.

By way of example, the at least one oxygen monolayer of the given group of layers may comprise an atomic percentage of $^{18}O$ greater than 50 percent, and more particularly greater than 90 percent. The at least one oxygen monolayer of the given group of layers may further comprises $^{16}O$ in some embodiments. In an example embodiment, the at least one oxygen monolayer of each group of layers may comprise an atomic percentage of $^{18}O$ greater than 10 percent.

In one example configuration, the method may further include forming source and drain regions on the semiconductor layer and defining a channel in the superlattice, and forming a gate above the superlattice. In accordance with another example embodiment, the method may further include forming a metal layer above the superlattice. Furthermore, in some embodiments the superlattice may divide the semiconductor layer into a first region and a second region, with the first region having a same conductivity type and a different dopant concentration than the second region. In accordance with another example implementation, the superlattice may divide the semiconductor layer into a first region and a second region, with the first region having a different conductivity type than the second region. By way of example, the base semiconductor layer may comprise silicon.

BRIEF DESCRIPTION OF THE DRAWINGS

FIG. 8 is a table showing $^{18}O$ and $^{16}O$ dose loss for the implementation of FIG. 7.

DETAILED DESCRIPTION

Figure 1:
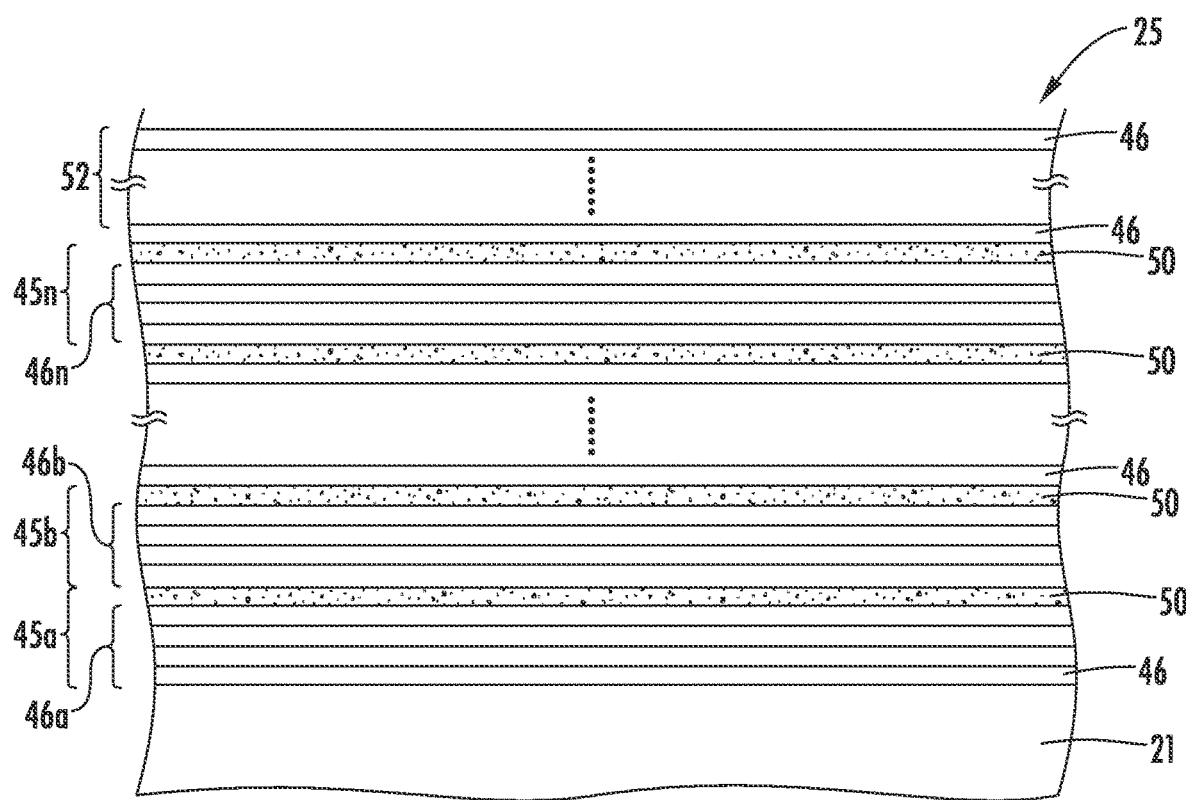
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to the formation of semiconductor devices utilizing an enhanced semiconductor superlattice. The enhanced semiconductor superlattice may also be referred to as an "MST" layer/film or "MST technology" in this disclosure.

More particularly, the MST technology relates to advanced semiconductor materials such as the superlattice 25 described further below. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

for electrons and:

$$M_{h,ij}^{-1}(E_F, T) = \frac{-\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again, Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
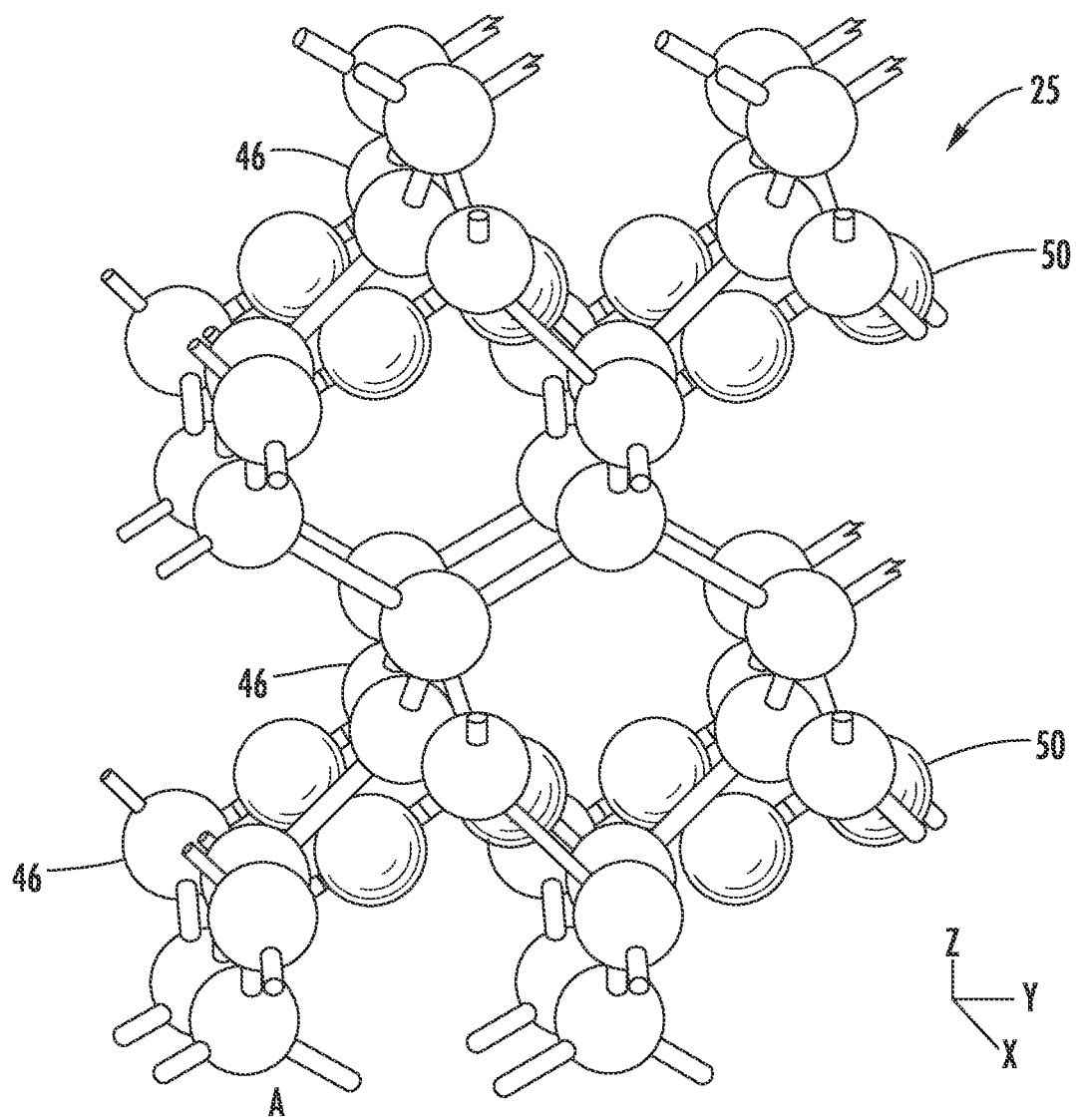
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. By way of example, the cap layer 52 may have between 1 to 100 monolayers 46 of the base semiconductor, and, more preferably between 10 to 50 monolayers. However, in some applications the cap layer 52 may be omitted, or thicknesses greater than 100 monolayers may be used.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example.

It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed, it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
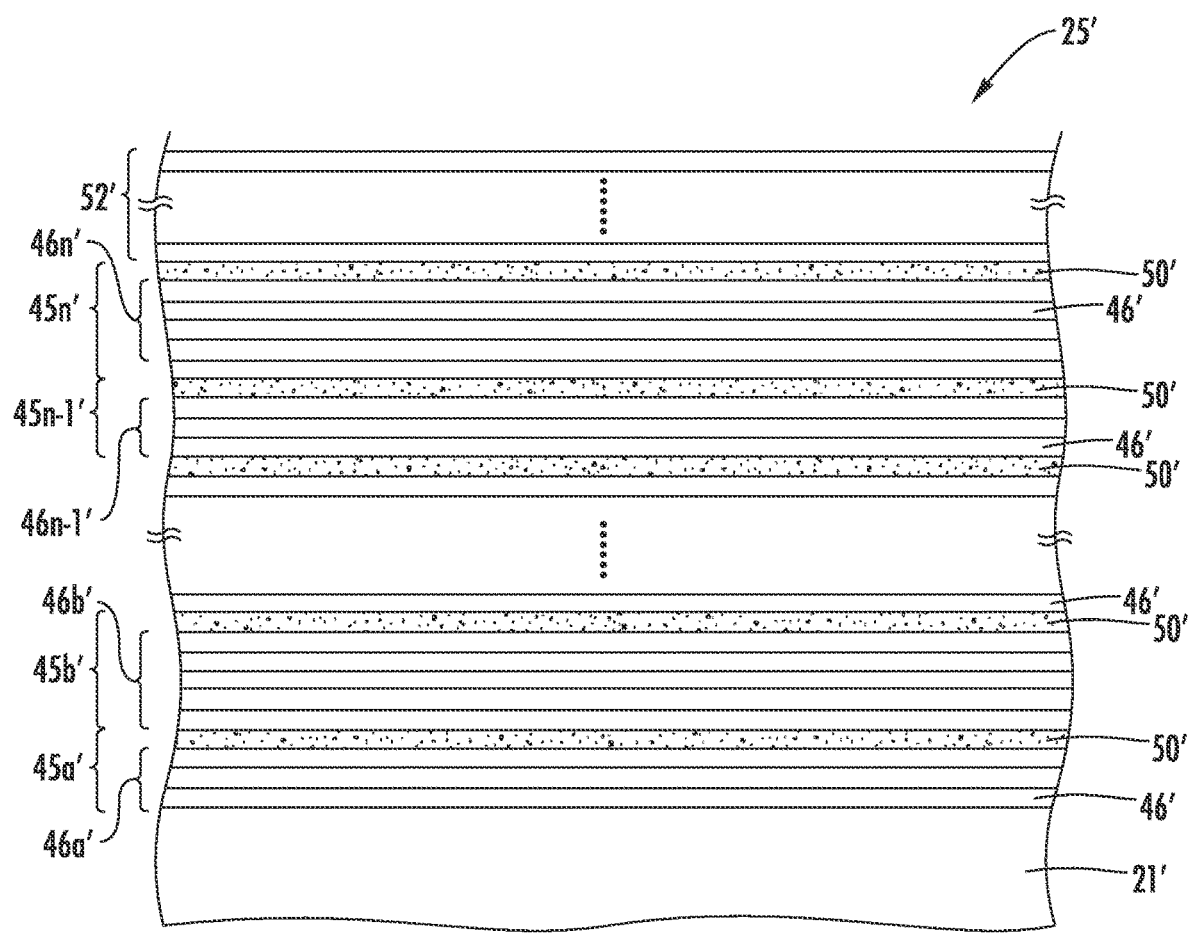
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
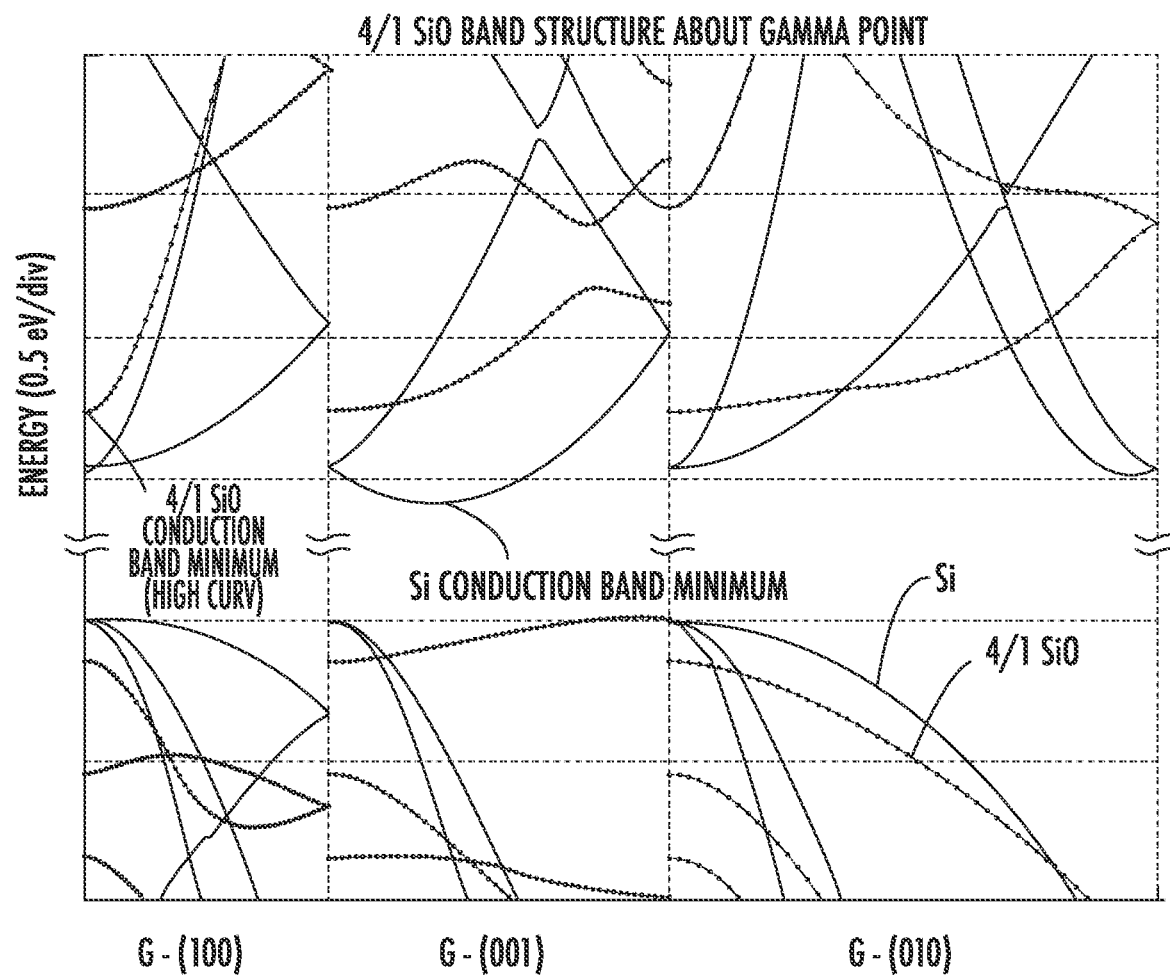
FIG. 4A is a graph of the calculated band structure from the gamma point (G) for both bulk silicon as in the prior art, and for the 4/1 Si/O superlattice as shown in FIGS. 1-2.
Figure 4B:
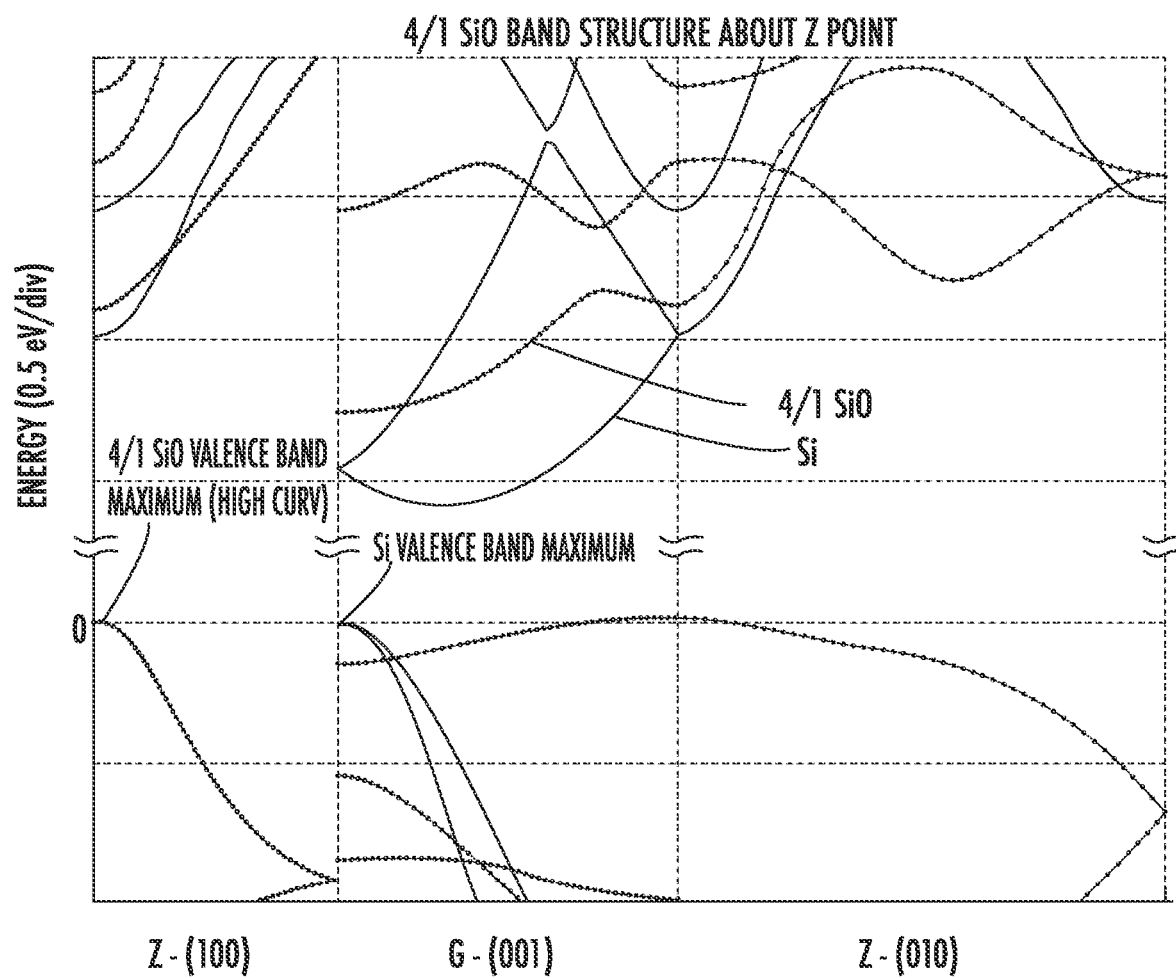
FIG. 4B is a graph of the calculated band structure from the Z point for both bulk silicon as in the prior art, and for the 4/1 Si/O superlattice as shown in FIGS. 1-2.
Figure 4C:
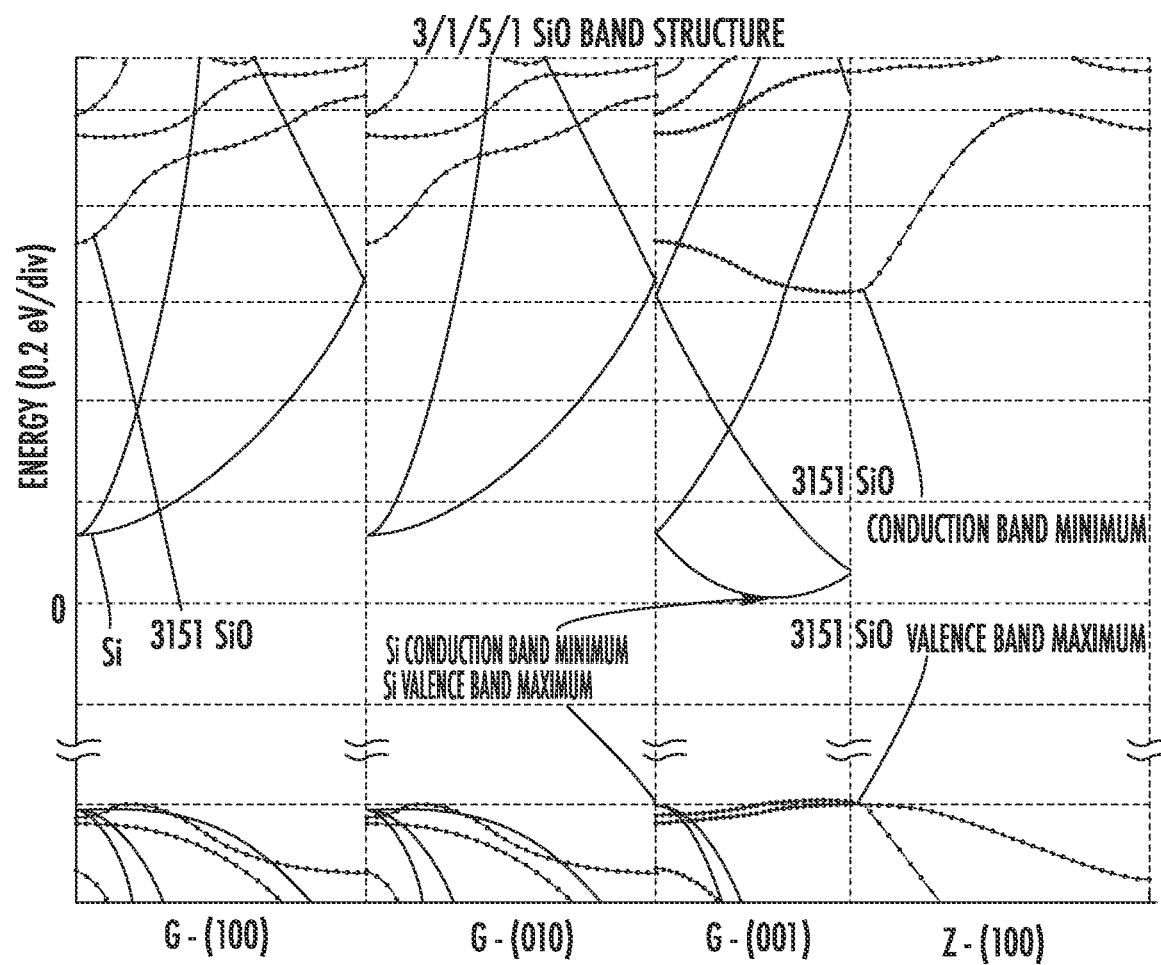
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However, the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus, the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
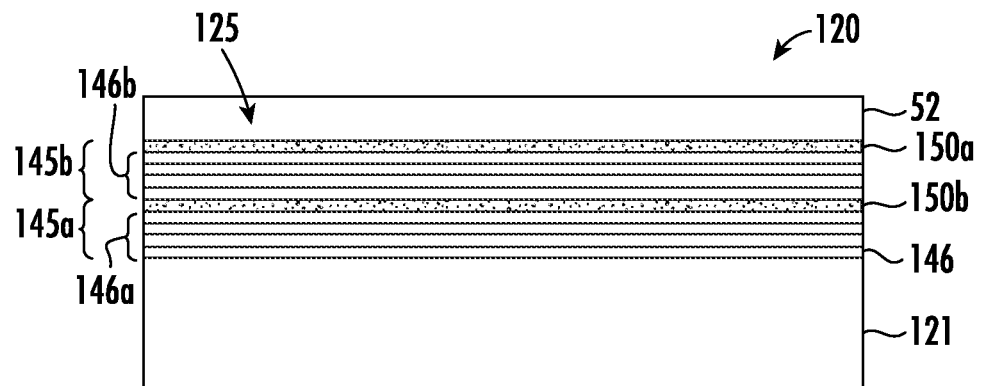
FIG. 5 is a schematic cross-sectional view of a semiconductor device including a superlattice with an enriched $^{18}O$ monolayer in accordance with an example embodiment.

Turning now to FIG. 5, in some embodiments the above-described superlattice films 25 may be fabricated with one or more oxygen monolayers 50 which have an increased or enhanced amount of $^{18}O$. In a typical fabrication process, the approximate concentration of stable oxygen isotopes present in the gas flow used for oxygen deposition may be as follows:

| Isotope | Mass (Da) | [%] |
|---|---|---|
| $^{16}O$ | 15.99492 | 99.757 |
| $^{17}O$ | 16.99913 | 0.038 |
| $^{18}O$ | 17.99916 | 0.205 |

In the semiconductor device 120 shown in FIG. 5, a superlattice 125 is formed adjacent a semiconductor layer 121 (e.g., substrate) which includes two groups of monolayers 145a, 145b, each including a base semiconductor portion 146a, 146b with four semiconductor (e.g., silicon) monolayers 146, and a respective oxygen monolayer 150a, 150b. However, it should be noted that other base semiconductor portion thicknesses may be used in different embodiments, e.g., up to twenty-five monolayers 146 or even fifty monolayers (or more) in some implementations. While the oxygen monolayer 150b is fabricated using a typical gas flow, the oxygen monolayer 150a is fabricated using a gas flow having an enhanced or increased amount of $^{18}O$ to thereby provide an $^{18}O$ enriched monolayer. By way of example, the monolayer 150a may comprise an atomic percentage of $^{18}O$ greater than ten percent. That is, the number of $^{18}O$ atoms present in the monolayer 150a may constitute 10% or more of the total oxygen atoms in this monolayer(s). In other example embodiments, the atomic percentage of $^{18}O$ atoms in the monolayer 150a may be greater than fifty percent of the total oxygen atoms, and more particularly greater than ninety percent. In any case, the $^{18}O$ enriched monolayer 150a may also include some portion of $^{16}O$.

Figure 6:
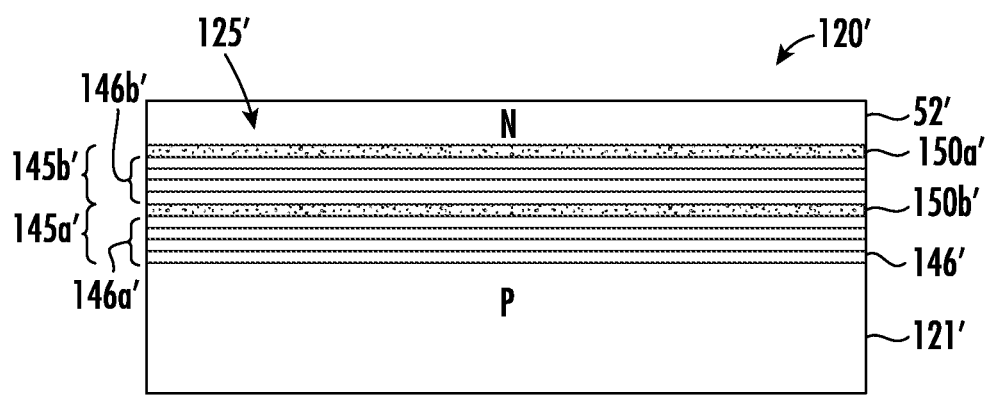
FIG. 6 is a schematic cross-sectional view of another semiconductor device including a superlattice with a plurality of enriched $^{18}O$ monolayers and dividing a semiconductor layer into regions of different conductivity types.

Referring additionally to the semiconductor device 120' of FIG. 6, in some implementations more than one $^{18}O$ enriched monolayer 150a' may be used. Here, each of the two groups of layers 145a', 145b' has a respective $^{18}O$ enriched monolayer 150a'. Other superlattice layer configurations may also be used in different embodiments.

The use of one or more $^{18}O$ enriched monolayers 150a in an MST layer may be advantageous in view of the kinetic isotope effect of interstitial oxygen within the semiconductor (e.g., silicon) lattice of the base semiconductor portions 146a, 146b. More particularly, free oxygen atoms in silicon are relatively highly mobile, which may lead to unwanted diffusion via an interstitial mechanism. Diffusion of oxygen is thermally activated, and is therefore susceptible to occur in subsequent thermal processing steps (e.g., gate formation, etc.) after the superlattice 125 formation. Because $^{18}O$ is chemically equivalent to $^{16}O$ in terms of its nuclear spin (both are 0), it is well suited for use in the above-described superlattice structures where oxygen monolayers with typical $^{16}O$ concentrations would otherwise be used. However, as a result of the kinetic isotope effect, activation energy for a lighter isotope is less than for a heavier isotope. In the present example, $^{16}O$ is a lighter isotope than $^{18}O$, meaning that $^{18}O$ will have a higher activation energy than $^{16}O$. Thus, activated processes for $^{18}O$ are accordingly slower, meaning that $^{18}O$ will diffuse more slowly than $^{16}O$. As a result, and as theorized by Applicant without wishing to be bound thereto, $^{18}O$ enriched monolayers 150a will experience less diffusion/oxygen loss during the above-noted thermal processing, for example.

Figure 7:
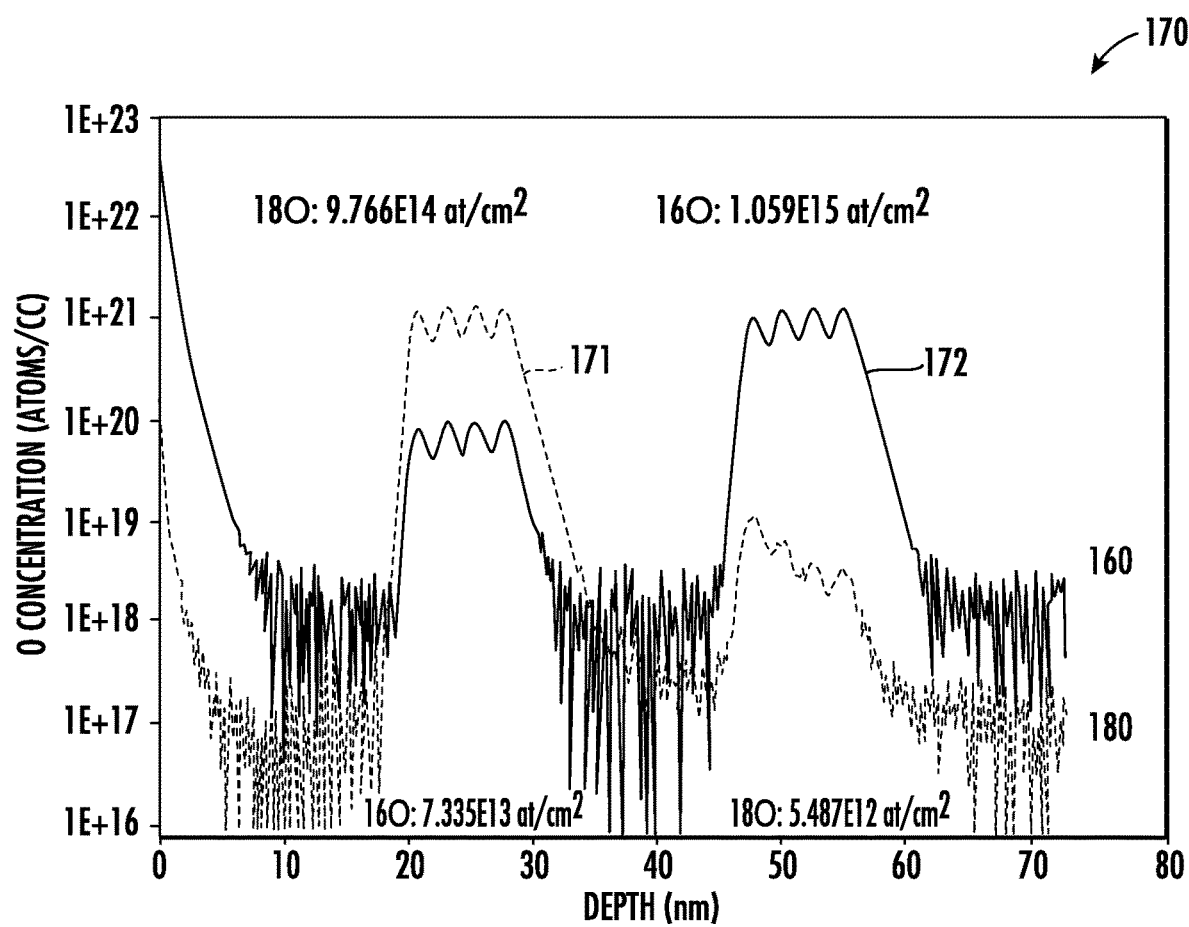
FIG. 7 is a graph of measured oxygen concentration vs depth for a test semiconductor device including typical $^{16}O$ monolayers and $^{18}O$ enhanced monolayers.
Figure 9:
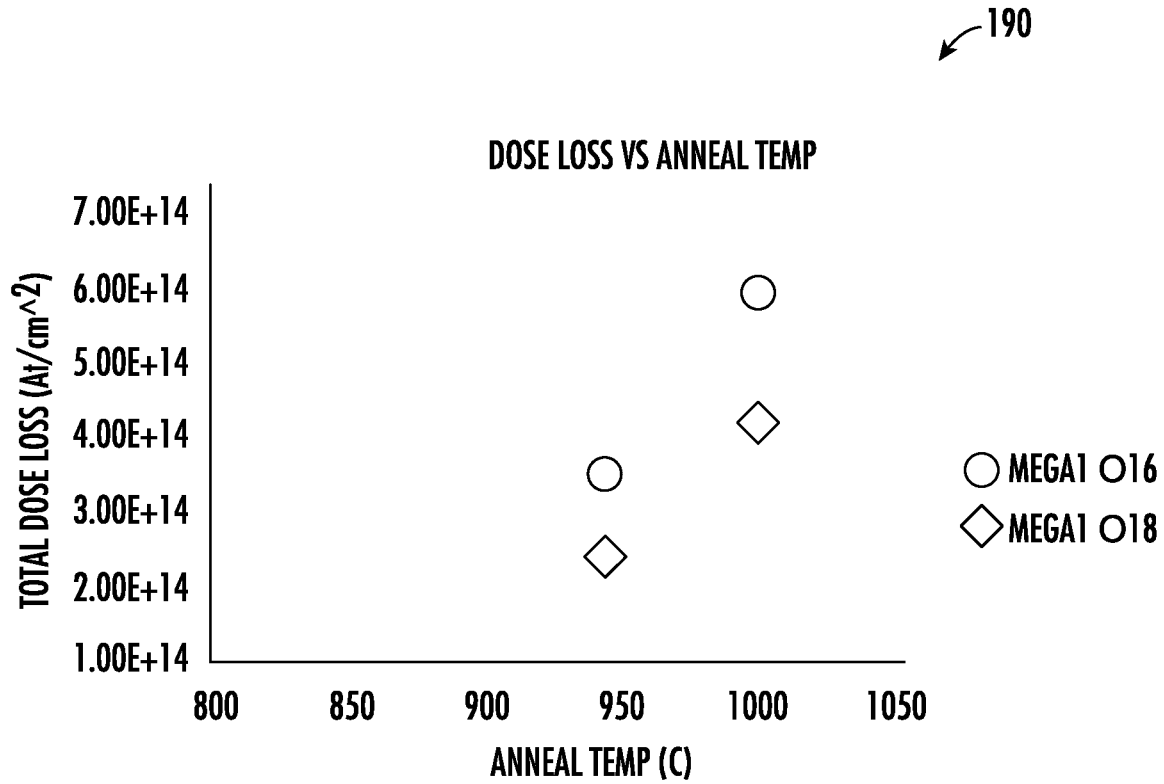
FIG. 9 is a graph of $^{18}O$ and $^{16}O$ dose loss vs. anneal temperature for the implementation of FIG. 7.
Figure 10:
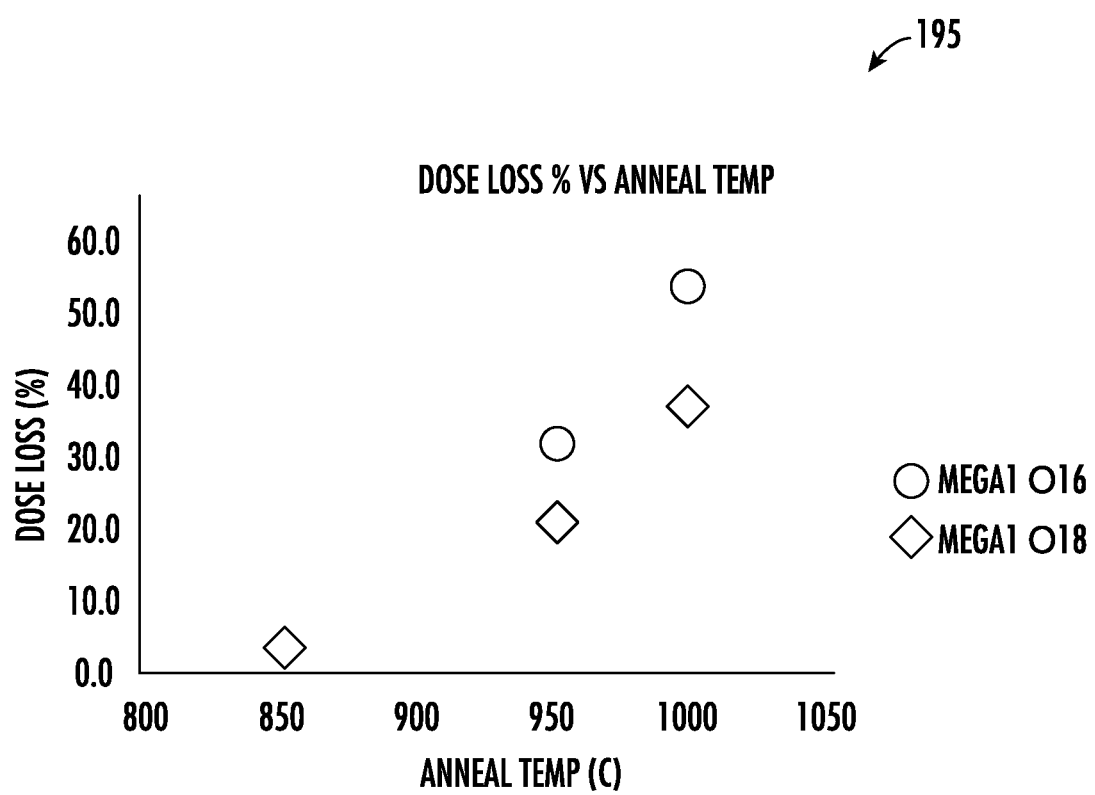
FIG. 10 is a graph of $^{18}O$ and $^{16}O$ dose loss percentage vs. anneal temperature for the implementation of FIG. 7.

The foregoing will be further understood with reference to the graph 170 of FIG. 7, table 180 of FIG. 8, and graphs 190, 195 of FIGS. 9 and 10 representing test results from a fabricated device including four $^{16}O$ monolayers and four $^{18}O$ enriched monolayers. The test device was fabricated using an etch-back procedure (referred to as "MEGA" in the figures) during fabrication that is described further in U.S. Pat Nos. 10,566,191 and 10,811,498 to Weeks et al., which are assigned to the present Applicant and hereby incorporated herein in their entireties by reference. The $^{18}O$ concentration is represented by the plot line 171, while the $^{16}O$ concentration is represented by the plotline 172. It may be seen that the location of the oxygen monolayer 150a occurs between 20 and 30 nm from the surface and has an $^{18}O$ concentration in a range of $1\times10^{21}$ atoms/cm$^3$. The corresponding measurements for the test film are shown in the table 180 of FIG. 8, the corresponding dose loss vs. anneal temperature is shown in the graph 190, and the corresponding dose loss percentage vs. anneal temperature is shown in the graph 195 of FIG. 10.

Numerous types of semiconductor structures may be fabricated with, and benefit from, the above-described $^{18}O$ enhanced superlattices 120 or 120'. One such device is a planar MOSFET 220 now described with reference to FIG. 11. The illustrated MOSFET 220 includes a substrate 221, source/drain regions 222, 223, source/drain extensions 226, 227, and a channel region therebetween provided by an $^{18}O$ enhanced superlattice 225. The channel may be formed partially or completely within the superlattice 225. Source/drain silicide layers 230, 231 and source/drain contacts 232, 233 overlie the source/drain regions as will be appreciated by those skilled in the art. Regions indicated by dashed lines 234a, 234b are optional vestigial portions formed originally with the superlattice 225, but thereafter heavily doped. In other embodiments, these vestigial superlattice regions 234a, 234b may not be present as will also be appreciated by those skilled in the art. A gate 235 illustratively includes a gate insulating layer 237 adjacent the channel provided by the superlattice 225, and a gate electrode layer 236 on the gate insulating layer. Sidewall spacers 240, 241 are also provided in the illustrated MOSFET 220.

Figure 12:
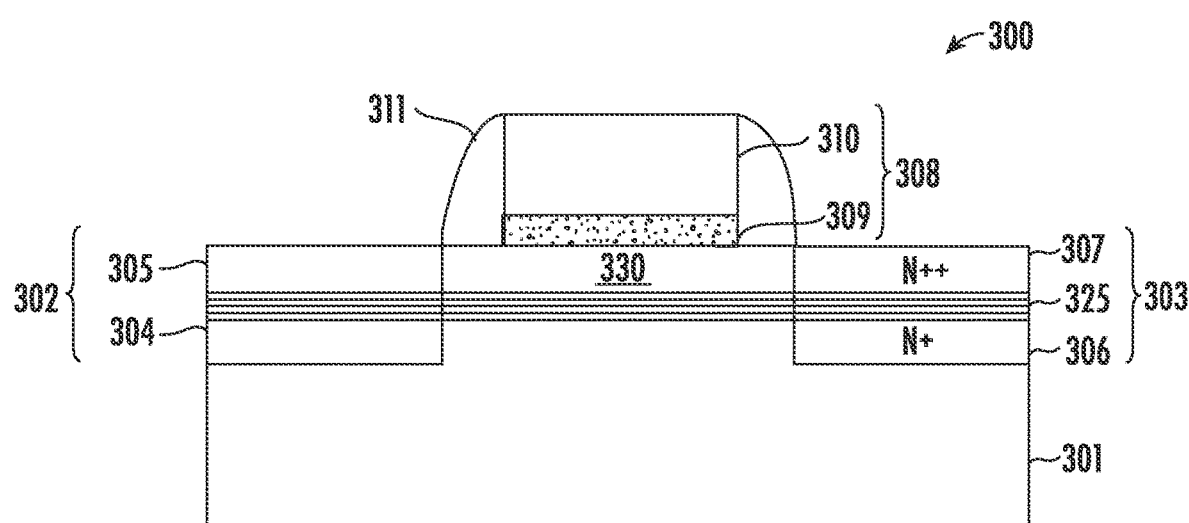
FIG. 12 is a schematic cross-sectional view of a semiconductor device including a superlattice with one or more enriched $^{18}O$ monolayers and dividing a semiconductor layer into regions having a same conductivity type and different dopant concentrations.

Referring additionally to FIG. 12, in accordance with another example of a device in which an $^{18}O$ enriched superlattice 325 may be incorporated is a semiconductor device 300, in which the superlattice is used as a dopant diffusion blocking superlattice to advantageously increase surface dopant concentration to allow a higher $N_D$ (active dopant concentration at metal/semiconductor interface) during in-situ doped epitaxial processing by preventing diffusion into a channel region 330 of the device. More particularly, the device 100 illustratively includes a semiconductor layer or substrate 301, and spaced apart source and drain regions 302, 303 formed in the semiconductor layer with the channel region 330 extending therebetween. The dopant diffusion blocking superlattice 325 illustratively extends through the source region 302 to divide the source region into a lower source region 304 and an upper source region 305, and also extends through the drain region 303 to divide the drain region into a lower drain region 306 and an upper drain region 307.

The dopant diffusion blocking superlattice 325 may also conceptually be considered as a source dopant blocking superlattice within the source region 302, a drain dopant blocking superlattice within the drain region 303, and a body dopant blocking superlattice beneath the channel 330, although in this configuration all three of these are provided by a single blanket deposition of the MST material across the substrate 301 as a continuous film. The semiconductor material above the dopant blocking superlattice 325 in which the upper source/drain regions 305, 307 and channel region 330 are defined may be epitaxially grown on the dopant blocking superlattice 325 either as a thick superlattice cap layer or bulk semiconductor layer, for example. In the illustrated example, the upper source/drain regions 305, 307 may each be level with an upper surface of this semiconductor layer (i.e., they are implanted within this layer).

As such, the upper source/drain regions 305, 307 may advantageously have a same conductivity as the lower source/drain regions 304, 306, yet with a higher dopant concentration. In the illustrated example, the upper source/drain regions 305, 307 and the lower source/drain regions 304, 306 are N-type for a N-channel device, but these regions may also be P-type for a P-channel device as well. Surface dopant may be introduced by ion implantation, for example. Yet, the dopant diffusion is reduced by the MST film material of the diffusion blocking superlattice 325 because it traps point defects/interstitials introduced by ion implantation which mediate dopant diffusion.

The semiconductor device 300 further illustratively includes a gate 308 on the channel region 330. The gate illustratively includes a gate insulating layer 309 gate electrode 310. Sidewall spacers 311 are also provided in the illustrated example. Further details regarding the device 300, as well as other similar structures in which an $^{18}$O enriched superlattice may be used, are set forth in U.S. Pat. No. 10,818,755 to Takeuchi et al., which is assigned to the present Applicant and hereby incorporated herein in its entirety by reference.

Figure 13:
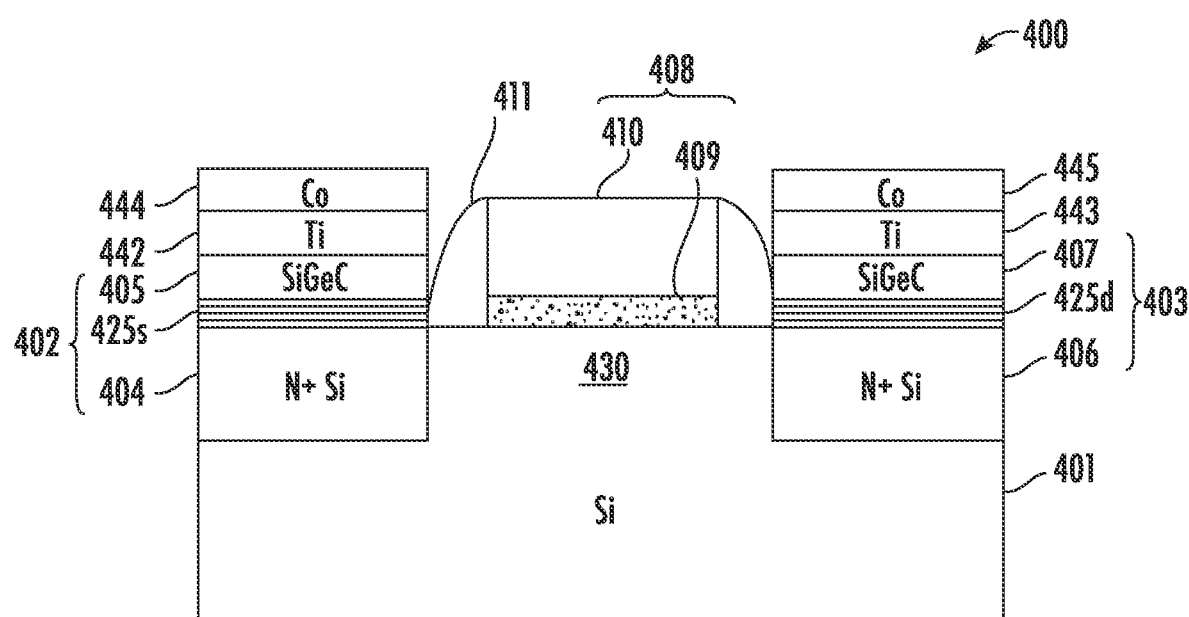
FIG. 13 is a schematic cross-sectional view of a semiconductor device including a superlattice with one or more enriched $^{18}O$ monolayers and including a metal contact layer above the superlattice.

Turning to FIG. 13, another example embodiment of a semiconductor device 400 in which an $^{18}$O enriched superlattice may be used is now described. More particularly, in the illustrated example both source and drain dopant diffusion blocking superlattices 425s, 425d advantageously provide for Schottky barrier height modulation via heteroepitaxial film integration. More particularly, the lower source and drain regions 404, 406 include a different material than the upper source and drain regions 405, 407. In this example, the lower source and drain regions 404, 406 are silicon, and the upper source and drain regions 405, 407 are SiGeC, although different materials may be used in different embodiments. Lower metal layers (Ti) 442, 443 are formed on the upper source and drain regions (SiGeC layers) 405, 407. Upper metal layers (Co) 444, 445 are formed on the lower metal layers 442, 443, respectively. Because the MST material is effective in integrating hetero-epitaxial semiconductor material, incorporation of C(1-2%) to Si or SiGe on Si may induce a positive conduction band offset. More particularly, this is a SiGeC/MST/n+ Si structure that is effective for reducing Schottky barrier height. Further details regarding the device 400 are set forth in the above-noted '755 patent.

One skilled in the art, however, will appreciate that the materials and techniques identified herein may be used in many different types of semiconductor devices, such as discrete devices and/or integrated circuits. Referring again to FIG. 6, in the context of dopant blocking applications, the $^{18}$O enriched superlattice 125' divides the substrate 121' and the cap layer 52', but the substrate has a different conductivity type (P) than the cap layer (N) to thereby define a PN junction. In other example embodiments, the PN junction may be lateral, as opposed to vertically oriented as shown in the example of FIG. 6. Further PN junction applications in which $^{18}$O enriched superlattice may be used are set forth in U.S. Pat. No. 7,227,174 to Mears et al., which is assigned to the present Applicant and hereby incorporated herein in its entirety by reference. It should also be noted that in some embodiments, $^{18}$O enriched monolayers may also be incorporated in superlattices and associated applications such as those described in co-pending application Ser. Nos. 17/236,289 and 17/236,329 filed Apr. 21, 2021, which are hereby incorporated herein in their entireties by reference.

Applicant theorizes, without wishing to be bound thereto, that an $^{18}$O source can be used interchangeably with traditional $^{16}$O sources to fabricate the above-described semiconductor superlattices. Moreover, Applicant has found that similar $^{18}$O flow rates yield similar oxygen dosages to those of $^{16}$O. Furthermore, the semiconductor monolayer growth and etch rates are also similar between $^{16}$O and $^{18}$O sources. Phenomenological study/observations have revealed that $^{16}$O incorporation in the $^{18}$O superlattice layers is affected by the above-described MEGA etch. More particularly, with respect to the test device represented in FIG. 7, implementations of the device without the MEGA etch showed the first $^{16}$O to be lower than the other three $^{16}$O peaks in the same stack, whereas adding a MEGA etch before the first oxygen dosing cycle resulted in a superlattice stack with all four $^{16}$O peaks being of the same concentration. By way of example, $^{18}$O dose retention may be 30% better (or more) than $^{16}$O dose retention.

A related method for making a semiconductor device 120 may include forming a semiconductor layer 121, and forming a superlattice 125 adjacent the semiconductor layer and including stacked groups of layers 145a, 145b. Each group of layers 145a, 145b may include stacked base semiconductor monolayers 146 defining a base semiconductor portion 146a, 146b, and at least one oxygen monolayer 150a constrained within a crystal lattice of adjacent base semiconductor portions. The at least one oxygen monolayer 150a may comprise an atomic percentage of $^{18}$O greater than 10 percent, as discussed further above.

Figure 11:
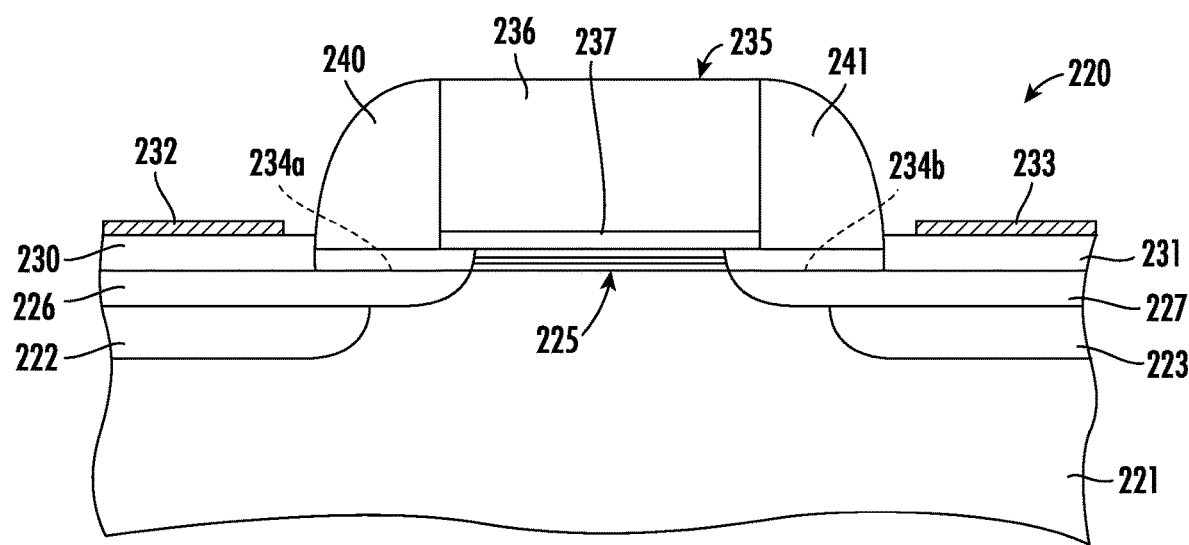
FIG. 11 is a schematic cross-sectional view of a semiconductor device including a superlattice channel with one or more enriched $^{18}O$ monolayers.

In accordance with the example of FIG. 11, further method aspects may include forming source and drain regions 222, 223 on the semiconductor layer 221 and defining a channel in the superlattice 225, and forming a gate 235 above the superlattice. In accordance with the example of FIG. 13, further method aspects may include forming a metal layer 442/444 and/or 443/445 above the superlattice 425s, 425d, as discussed further above.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A method for making a semiconductor device comprising:
   forming a semiconductor layer; and
   forming a superlattice adjacent the semiconductor layer and comprising a plurality of stacked groups of layers, each group of layers comprising a plurality of stacked base semiconductor monolayers defining a base semiconductor portion, and at least one oxygen monolayer constrained within a crystal lattice of adjacent base semiconductor portions;
   the at least one oxygen monolayer of a given group of layers comprising an atomic percentage of $^{18}$O greater than 10 percent.

2. The method of claim 1 wherein the at least one oxygen monolayer of the given group of layers comprises an atomic percentage of $^{18}$O greater than 50 percent.

3. The method of claim 1 wherein the at least one oxygen monolayer of the given group of layers comprises an atomic percentage of $^{18}$O greater than 90 percent.

4. The method of claim 1 wherein the at least one oxygen monolayer of the given group of layers further comprises $^{16}$O.

5. The method of claim 1 wherein the at least one oxygen monolayer of each group of layers comprises an atomic percentage of $^{18}$O greater than 10 percent.

6. The method of claim 1 further comprising forming source and drain regions on the semiconductor layer and defining a channel in the superlattice, and forming a gate above the superlattice.

7. The method of claim 1 wherein the superlattice divides the semiconductor layer into a first region and a second region, with the first region having a same conductivity type as the second region and a different dopant concentration than the second region.

8. The method of claim 1 further comprising forming a metal layer above the superlattice.

9. The method of claim 1 wherein the superlattice divides the semiconductor layer into a first region and a second region, with the first region having a different conductivity type than the second region.

10. The method of claim 1 wherein the base semiconductor layer comprises silicon.

11. A method for making a semiconductor device comprising:
forming a semiconductor layer; and
forming a superlattice adjacent the semiconductor layer and comprising a plurality of stacked groups of layers, each group of layers comprising a plurality of stacked base silicon monolayers defining a base silicon portion, and at least one oxygen monolayer constrained within a crystal lattice of adjacent base silicon portions;
the at least one oxygen monolayer of a given group of layers comprising an atomic percentage of $^{18}O$ greater than 50 percent.

12. The method of claim 11 wherein the at least one oxygen monolayer of the given group of layers comprises an atomic percentage of $^{18}O$ greater than 90 percent.

13. The method of claim 11 wherein the at least one oxygen monolayer of the given group of layers comprises $^{16}O$.

14. The method of claim 11 wherein the at least one oxygen monolayer of each group of layers within the superlattice comprises an atomic percentage of $^{18}O$ greater than 50 percent.

15. The method of claim 11 further comprising forming source and drain regions on the semiconductor layer and defining a channel in the superlattice, and forming a gate above the superlattice.

16. The method of claim 11 wherein the superlattice divides the semiconductor layer into a first region and a second region, with the first region having a same conductivity type as the second region and a different dopant concentration than the second region.

17. The method of claim 11 further comprising forming a metal layer above the superlattice.

18. The method of claim 11 wherein the superlattice divides the semiconductor layer into a first region and a second region, with the first region having a different conductivity type than the second region.

19. A method for making a semiconductor device comprising:
forming a semiconductor layer; and
forming a superlattice adjacent the semiconductor layer and comprising a plurality of stacked groups of layers, each group of layers comprising a plurality of stacked base silicon monolayers defining a base silicon portion, and at least one oxygen monolayer constrained within a crystal lattice of adjacent base silicon portions;
each at least one oxygen monolayer constrained within the crystal lattice of adjacent base silicon portions comprising an atomic percentage of $^{18}O$ greater than 90 percent.

20. The method of claim 19 wherein each at least one oxygen monolayer comprises $^{16}O$.

21. The method of claim 19 further comprising forming source and drain regions on the semiconductor layer and defining a channel in the superlattice, and forming a gate above the superlattice.

22. The method of claim 19 wherein the superlattice divides the semiconductor layer into a first region and a second region, with the first region having a same conductivity type as the second region and a different dopant concentration than the second region.

23. The method of claim 19 further comprising forming a metal layer above the superlattice.

24. The method of claim 19 wherein the superlattice divides the semiconductor layer into a first region and a second region, with the first region having a different conductivity type than the second region.

* * * * *